United States Patent [19]
Bristol et al.

[11] Patent Number: 6,066,197
[45] Date of Patent: May 23, 2000

[54] COATINGS AND METHODS, ESPECIALLY FOR CIRCUIT BOARDS

[75] Inventors: Samuel Victor Bristol, Kokomo; Eugene Horace Hanaway, Rochester, both of Ind.; Thomas Richard Mueller, Swasrtz Creek; Mary Jane Barnaby, Grand Blanc, both of Mich.

[73] Assignee: Delphi Technologies, Inc., Troy, Mich.

[21] Appl. No.: 08/917,980

[22] Filed: Aug. 27, 1997

Related U.S. Application Data

[62] Division of application No. 08/500,543, Jul. 11, 1995, abandoned.

[51] Int. Cl.⁷ .............................. C23F 11/14; C08K 5/16
[52] U.S. Cl. ......................... 106/14.42; 106/14.15; 106/14.41; 106/14.44; 428/457
[58] Field of Search ............... 106/14.15, 14.41, 106/14.42, 14.44; 428/457

[56] References Cited

U.S. PATENT DOCUMENTS

| | | | |
|---|---|---|---|
| 2,715,084 | 9/1955 | Konig | 148/23 |
| 2,898,255 | 8/1959 | Thompson et al. | 148/23 |
| 2,904,459 | 9/1959 | Kubota | 148/23 |
| 2,926,108 | 2/1960 | Anderson | 117/127 |
| 3,235,414 | 2/1966 | Marks | 148/23 |
| 3,264,146 | 8/1966 | Marks | 148/23 |
| 3,305,406 | 2/1967 | Chmelik et al. | 148/23 |
| 3,467,556 | 9/1969 | Stayner | 148/25 |
| 3,787,227 | 1/1974 | Marans | 117/75 |
| 3,837,932 | 9/1974 | Aronberg | 148/23 |
| 4,168,996 | 9/1979 | Zado | 148/23 |
| 4,360,392 | 11/1982 | Roberts | 148/23 |
| 4,402,747 | 9/1983 | Bird et al. | 106/14.42 |
| 4,532,887 | 8/1985 | Forsterling | 118/429 |
| 4,684,544 | 8/1987 | Arnett | 427/96 |
| 4,781,788 | 11/1988 | Forsterling et al. | 156/630 |
| 5,004,509 | 4/1991 | Bristol | 148/23 |
| 5,092,943 | 3/1992 | Davis et al. | 148/23 |
| 5,145,722 | 9/1992 | Kaspaul | 427/388.1 |
| 5,281,281 | 1/1994 | Stefanowski | 148/23 |
| 5,297,721 | 3/1994 | Schneider et al. | 148/23 |
| 5,368,899 | 11/1994 | Litteral | 427/512 |

FOREIGN PATENT DOCUMENTS

| | | | |
|---|---|---|---|
| 0538822A1 | 10/1992 | European Pat. Off. | B23K 35/363 |
| 57-039177 | 3/1982 | Japan . | |
| 58-130384 | 8/1983 | Japan . | |
| 1017460A | 1/1982 | Russian Federation | B23K 35/36 |
| 801510 | 9/1958 | United Kingdom . | |
| 1151664 | 5/1969 | United Kingdom | C23F 11/10 |
| 2080341A | 7/1980 | United Kingdom | B23K 35/362 |
| 2181084A | 4/1987 | United Kingdom | B23K 1/02 |
| 2243623A | 11/1991 | United Kingdom | B23K 35/365 |

OTHER PUBLICATIONS

"Europeans Find Ways to Phase–Out CFCs," Electronic Packaging & Production, vol. 29, n1, Jan. 1989, pp. 26 & 28.
*Hapshire Hamposyl Surfacents*, W.R. Grace & Co., 1992, pp. 1, 23, 25–26.
Chemical Abstract No. 68:61558, abstract of Netherlands Patent Specification No. 6700642, Jul. 1967.
Chemical Abstract No. 96:183537, abstract of Japanese Patent Specification No. 57–007234, Jan. 1982.
Chemical Abstract No. 97:221525, abstract of Japanese Patent Specification No. 57–120662, Jul. 1982.
Chemical Abstract No. 108:225165, abstract of German Patent Specification No. 250338, Oct. 1987.
JAPIO abstract No. JP357185988A, abstract of Japanese Patent Specification No. 57–185998, No. 1982.
Derwent Abstract No. 84–072910/12, abstract of Soviet Union Patent Specification No. 1017460, May 1983.

*Primary Examiner*—Anthony Green
*Attorney, Agent, or Firm*—Jimmy L. Funke

[57] ABSTRACT

A coating composition for use in protecting metal, and for use as a soldering flux, and methods involving the same. A coating for circuit boards and processes involving the same. One coating material can serve as a metal corrosion inhibitor, a no-clean soldering flux, and/or a protective coating in replacement of a conformal coating. In its most preferred form, this invention serves all three functions in the manufacture of an electrical circuit board.

9 Claims, 4 Drawing Sheets

COATINGS AND METHODS, ESPECIALLY FOR CIRCUIT BOARDS

This is a division of application Ser. No. 08/500543 filed on Jul. 11, 1995, abandoned.

BACKGROUND OF THE INVENTION

1. Field of the Invention

This invention relates to coatings, and especially to circuit board coatings and processes. In this invention, a single coating material can serve as a corrosion inhibitor, a no-clean soldering flux, and/or a protective coating in replacement of a conformal coating. In its most preferred form, this invention serves all three functions. The invention also involves compositions, and products other than circuit boards too.

2. Prior Art

As indicated above, this invention is remarkable in that it is useful in any one or all of three separate phases of electronic circuit board manufacturing. The first phase involves manufacture of the circuit board itself, which is referred to herein as circuit board fabrication. This first phase delineates a copper circuit pattern on a non-conductive plastic substrate or support layer. The second phase of electronic circuit board manufacturing involves the soldering of components to the copper circuit pattern that was previously delineated on the circuit board. The third phase of electronic circuit board manufacturing involves treatment of the board after soldering, as for example applying a conformal coating to the assembled board.

The fact that this invention is useful in the second, or soldering, phase of electronic circuit board manufacturing is remarkable, in and of itself. The reason why it is remarkable, is that it provides a special type of soldering flux, as will more fully be hereinafter explained. This special type of flux is referred to herein as a no-clean flux. By no-clean, we mean that at least chlorofluorocarbons (CFCs) and other chlorinated organic solvents are not needed to remove flux residue after soldering. Water rinsing may even be unnecessary. This, alone, is significant. The electronics industry is trying to avoid using fluxes that leave residues that must be cleaned off, especially if they must be cleaned off using CFC and/or chlorinated solvents. Tests indicate that this invention leaves such little ionic residue that no cleaning at all may be needed for most applications.

In the first phase of electronic circuit board manufacturing, i.e., the fabrication phase, this invention involves applying a coating to the copper conductor pattern after the pattern is delineated on its insulating organic-based substrate material, and before components are soldered to it. The purpose of our coating in this phase of manufacturing is for preventing oxidation of the exposed surfaces of the copper pattern. More will be said about this later in this specification. If the board is stored for any length of time in air, the exposed surface of the copper film can oxidize. More will be said about this first aspect of the invention in the following detailed description of the invention.

As indicated above, the second phase of electronic circuit board manufacturing involves the soldering of electrical components to the board. In this second aspect of our invention, our coating can serve as a soldering flux. Even better, it can serve as a no-clean soldering flux. Even if the soldering requirement needs an added flux, our coating is wettable by molten solder. Hence, it need not be removed prior to soldering if it was previously applied as an antioxidant for the copper pattern in the first phase of manufacturing. In addition, organic acid activators can be added to the coating used in the first phase of manufacturing, to enhance fluxing action during the soldering phase. With the proper choice of activators, low ionic residues can still be obtained. More will be said about these features in the detailed description.

In the third phase of electronic circuit board manufacturing, one applies a conformal coating to the substantially completed board. By conformal coating, we mean a thick coating, usually polymeric, that is applied to an otherwise finished circuit board to protect the board from corrosion in humid environments. Our coating is more than just compatible with conformal coatings. In many instances, it passivates the copper surfaces well enough by itself to eliminate the need for a conformal coating.

All will be understood, the elimination of processing steps eliminates the direct costs of performing such steps. However, it also eliminates the indirect costs of apparatus needed for the steps, factory floor space, etc.

OBJECTS AND SUMMARY OF THE INVENTION

It is therefore an object of this invention to provide an improved coating on an electronic circuit board.

It is another object of this invention to provide a coating on a circuit board that can be used as a passivating coating for a copper film on the circuit board.

It is an object to provide a passivating coating on a circuit board immediately after patterning of its circuit and/or just prior to soldering of components onto that circuit board.

It is still another object of the invention to provide a protective coating on a circuit board that can supplant and/or enhance use of a conformal coating on that circuit board.

A further object of this invention is to provide a coating on a circuit board that can serve useful functions during circuit board fabrication, soldering of components to the circuit board, and during use of the circuit board.

Other objects include the provision of improved coating compositions, methods of applying such compositions, and the use of such compositions in all three phases of circuit board manufacture.

These and still other objects, features and advantages of the invention are obtained by coating a printed circuit board with an organic compound having a fatty acyl group and a free organic acid group that are directly connected to the same Hydrogen atom. In such connection, the acyl portion of the fatty acyl group is attached to the nitrogen, and an alpha or beta carbon of the organic acid is attached to the nitrogen. The nitrogen has a third bond, to which another alkyl group can be attached. The principal component of our coating can be, by way of example, an N-fatty acyl sarcosine acid, which has been characterized by some parties as a derivative of an amino acid. However, N-fatty acyl sarcosine acid may also be characterized as an N-alkyl derivative of a fatty acyl amide that provides a free carboxyl functional group.

The coating of this invention can also include other substances in mixture therewith. For example, an organic acid activator could be mixed with our fatty acyl amide derivative. Preferably, the organic acid activator is the distinctive adipic acid/glutaric acid/succinic acid mixture described and claimed in U.S. Pat. No. 5,004,509 which was issued to S. V. Bristol, one of the co-inventors hereof. The coating of our invention can also contain a nonionic wetting agent, such as a fluorochemical surfactant.

The coating of our invention is applied by dissolving or dispersing the coating components in a volatile carrier that preferably leaves no significant ionic residue, as for example an alcohol, a blend of an alcohol and deionized water, and a blend of deionized water and N-methyl-2-pyrrolidone. The resultant blend is applied to the circuit board by dipping, spraying, brushing, rolling or any other convenient technique, followed by drying. The resultant coating can be applied in one or more layers after circuit board fabrication, and/or before soldering, and/or after soldering.

The amide portion is believed to be involved with bonding to or chelation with copper, to provide copper passivation. The organic acid portion makes the compound act as a flux and be wettable by molten solder. The fatty acyl portion makes the compound hydrophobic, which eliminates a need for conformal coatings.

DESCRIPTION OF THE PREFERRED EMBODIMENTS

This invention involves a coating solution and a coating composition having many potential uses. We are most interested at this time in its application to electrical circuit boards, in any or all of three phases of circuit board manufacturing. The three phases are fabrication, soldering and conformal coating. Before describing specific compositional details of our coating, we shall describe the applications of our coating, and broadly why our coating has the effect that it does in each particular application. Then we shall describe details of preferred and alternative embodiments of our coating.

This invention is primarily intended to be applicable to conventional circuit boards having a patterned layer of copper disposed on one or both opposed external surfaces of an insulating sheet-like or strip-like support layer. Such products may even have one or more internal copper layers, parallel to the external ones. Of primary interest are the circuit boards in which the insulating sheet is of reinforced plastic. One typical type is made of many paper-like layers, or fiberglass sheets, that are compressed together, and bonded with an organic resin of epoxy or the like. On the other hand this invention would also be applicable to circuit boards having patterned copper layers on a flexible, i. e., un-reinforced, insulating plastic sheet or strip of polyamide, polyimide, or the like. We refer to the latter circuit boards as flexible circuit boards. Still further, this invention may even have some applicability to circuit boards in which the insulating sheet is an alumina substrate, or a porcelainized steel.

Figures 1, 2:
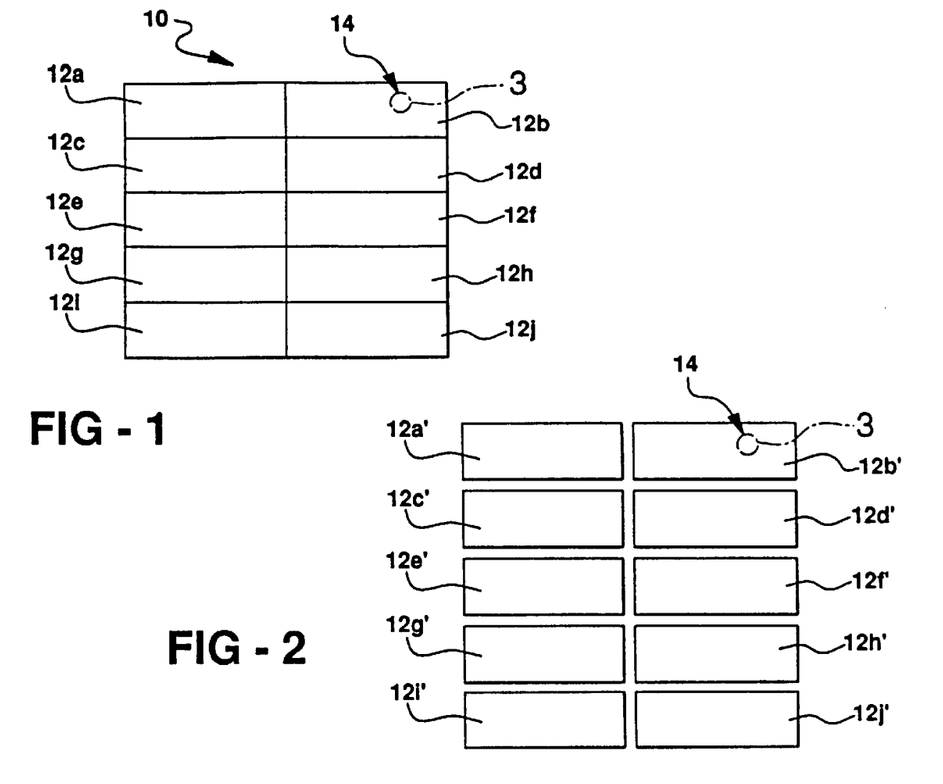
FIG. 1 is a simplistic plan view showing a large sheet of circuit board material on which a plurality of individual circuit boards are concurrently made.
FIG. 2 is a view showing the large sheet of FIG. 1 after it is cut into the separate circuit boards it comprises.

The balance of this discussion will focus on circuit boards having a flat rigid, i. e., reinforced, insulating base sheet and also having an exposed copper layer on at least one face. It should be noted that to reduce costs, circuit boards are not ordinarily made individually. Normally, a large sheet of circuit board material is processed that is large enough to contain a plurality of circuit board units. Such a board is shown in FIG. 1. The large sheet is referred to by reference numeral 10, with individual circuit boards being indicated by reference numerals 12a–12j. The large sheet 10 is processed to concurrently define all of the circuit board units 12a–12j. Then, after the large sheet 10 is fully processed, but before the soldering operation, it is often cut into the individual discreet circuit boards 12a'–12j' for further processing. This latter cutting-up process is referred to herein as singulation.

The starting sheet, or plate, 10 of the circuit board material is ordinarily purchased with a blanket film of copper already bonded to one or to both of its major faces. If the blanket of copper film is bonded to each of the two major faces of the insulating board, the board is referred to as a double-sided circuit board material. The copper film is ordinarily less than about 0.001 inch thick. The blanket copper film can be formed by bonding a copper foil to the major face of the insulating substrate. It can also be formed by a combination of electroless plating and electroplating, as for example is described in U.S. Pat. No. 4,781,788 Forsterling et al.

Figure 3:
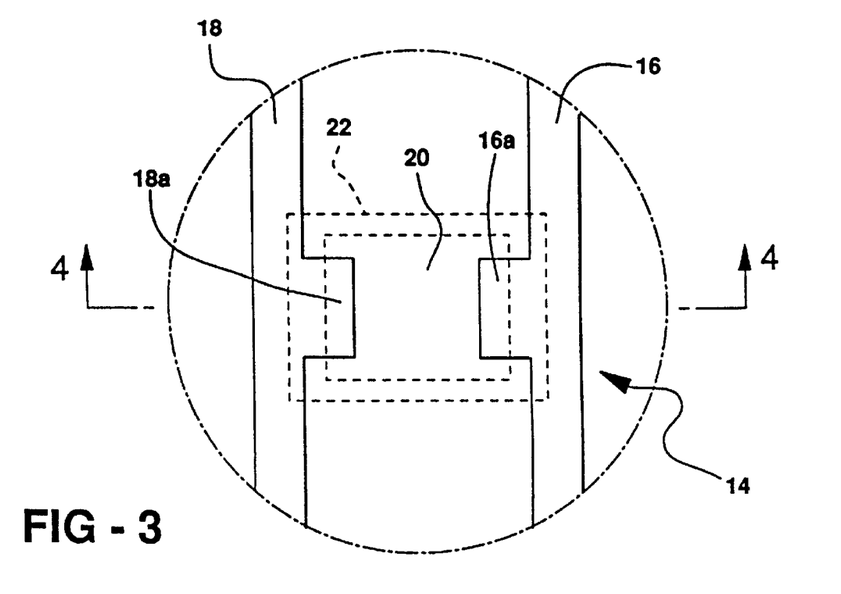
FIG. 3 is a fragmentary enlarged view of a circular area on one of the circuit board units of FIGS. 1 and 2.
Figure 4:
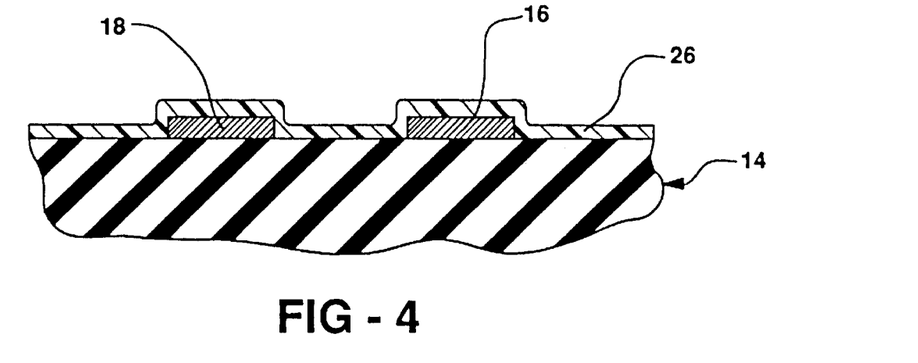
FIG. 4 is a sectional view along the line 4—4 of FIG. 3 showing our special coating on the circuit board surface prior to soldering.
Figure 5:
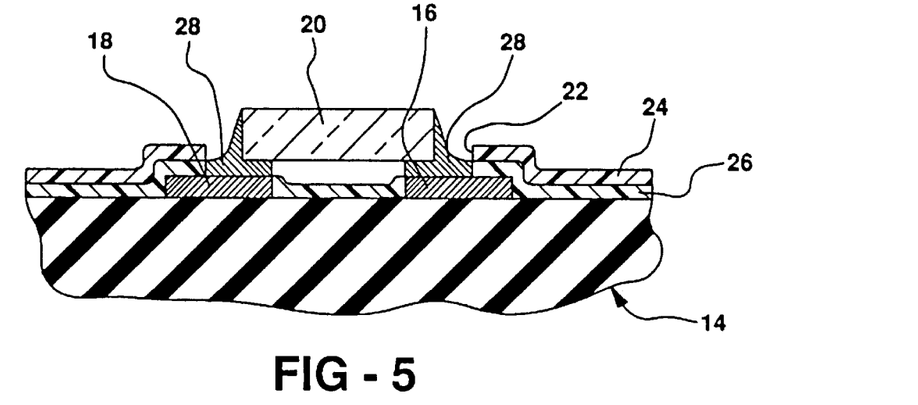
FIG. 5 is a sectional view showing the FIG. 4 article after a chip-like electrical component has been soldered to its surface.
Figure 6:
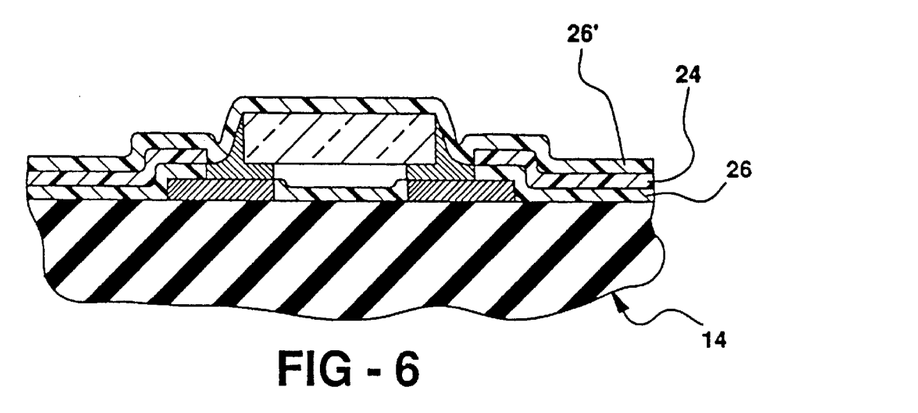
FIG. 6 is a sectional view showing the FIG. 5 article after an optional second application of our second coating.

As indicated, the copper can be applied as a blanket layer, and then etched to delineate a circuit pattern. A portion of that pattern is indicated by reference numeral 14 in FIGS. 1–2. It is shown in enlarged form in FIG. 3, and in successively treated form in FIGS. 4–6. The pattern would be most likely more complex than shown. It has been simplified for illustrative purposes. As shown in FIG. 3, the pattern would at least include two adjacent conductors 16 and 18, having projections 16a and 18a to which an electrical component 20, such as a resistor, might be attached. The component 20 is shown in phantom line in figure three because at this stage of manufacture, the component has not yet been attached. A window 22 in also shown in phantom line in FIG. 3. It represents a window 22 that will be formed in a subsequently applied solder resist coating 24 that is shown in FIGS. 5–6.

The pattern can also be made in other ways than is described in the above-mentioned U.S. Pat. No. 4,781,788 Forsterling. For example, the pattern could be delineated first, and then applied to the insulating substrate, if the pattern is not of too fine a definition. The above-mentioned U.S. Pat. No. 4,781,788 Forsterling et al. uses electroless plating to form a thin blanket layer, and then a selective electrodeposit to delineate the thicker circuit pattern. The teachings of U.S. Pat. No. 4,781,788 Forsterling et al. are incorporated herein by reference.

As pointed out in the U.S. Pat. No. 4,781,788 Forsterling et al., in one known technique for making a circuit board, after the copper pattern was defined, it was overplated with a tin-lead (60/40) solder. The solder protected the underlying fresh copper surface from oxidation prior to soldering components to the board. Hence, the solder layer later enhanced wetting of the copper pattern by molten solder. The solder coating also provided a masking function when etching away the exposed portions of the initial blanket electroless copper, one of the final steps in the circuit board fabrication process. This latter process has been generally referred to as solder mask over bare copper (SMOBC).

An organic solder resist coating is applied to the board to cover all areas of the copper pattern where contact with a molten source of solder is not desired. The resist coating is usually cured at an elevated temperature to make it durable. The curing treatment incidentally exposes the copper pattern to the same temperatures. Any copper that is exposed to air at such temperatures tends to oxidize. In the SMOBC process, the exposed copper is covered with a layer of plated solder. However, the plated solder layer is pervious to air at elevated temperatures. On the other hand, if fused, it becomes a sealing layer. It is fused by exposing the plated solder layer to a hot air flow, preferably a hot flow of a non-oxidizing gas. The fusing concurrently levels the solder surface. This latter process is referred to as hot air surface levelling (HASL). The so-fused solder layer then protects the copper from air oxidation at solder resist cure temperatures. One drawback to this process is that it has a tendency to produce higher ionic residues on the circuit board after soldering. This invention may prove to be useful as a final coating in the HASL process, to protect the solder and provide a flux-like coating in situ. On the other hand, we believe our coating is even more useful than that. We believe it provides an economical means for avoiding use of the HASL process itself.

It is now known that the HASL process, and the higher ionic residues it produces, can be avoided by stripping the solder masking layer off the copper. It is stripped off the copper surface after the copper pattern is fully delineated and preferably before singulation. After the solder layer is stripped from the copper, and sometimes also after singulation, a solder resist pattern is applied to the circuit board. The solder resist pattern selectively covers the copper pattern. It is applied by silk screening, curtain coating or the like, and then delineated by photoimaging techniques. After the pattern of the solder resist has been delineated, the resist material is cured by heating for a period at an elevated temperature. Then, if not singulated before the solder resist was applied, the large sheet can be singulated into smaller circuit boards, as hereinbefore mentioned.

However, as indicated above, during the curing of the solder resist and during any storage thereafter, portions of the copper pattern not covered by the resist pattern will oxidize. In one prior art technique, the resist-coated circuit board is given an acid clean, and then a micro etch, just before soldering. This removes any oxide or other contaminants on the surface of the exposed portions of the copper pattern, to insure each exposed soldering site is clean. In an alternative prior art method, one protects the solder sites from oxidation during solder resist cure and subsequent storage. The protection from oxidation is provided by coating the uncured resist-coated circuit boards with an imidazole coating. The imidazole coating is a commercially available material that is applied in a thin layer, less than 0.001 inch. It protects the copper from oxidation during curing of the solder resist material at an elevated temperature and also during storage in the factory before use. An advantage of the imidazole coating is that it does not have to be removed before soldering components to the boards. It is compatible with the fluxes usually used, with molten solder, and does not significantly increase ionic residue after soldering.

Our coating can do this and more. That is why we chose to show the copper layer as not having a plated solder layer in FIGS. 3–6. Our coating can be applied before and/or after the solder resist coating is applied. FIGS. 4–6 show our coating as reference numeral 26. Our coating is shown in FIGS. 4–6 as covering the entire board. Application of our coating to any fresh, i.e., clean, copper surface protects that clean copper surface from oxidation. Our coating is usually applied with solutions that at least provide a continuous coating. Somewhat thicker coatings, than what is merely needed to be continuous, might be desired in certain applications. In some instances, a continuous coating may be obtained with thicknesses of only about 0.0005 inch. In other instances, the coating may have to be about 0.001 or 0.002 inch thick, or even greater, to be continuous. Two applications of the coating solution might be desirable, for some uses. One example might be where objectionable pin holes occur in a first application. In such instance, an even thicker coating than 0.002 inch might result from the two applications of the coating solution.

The principal ingredient of our coating 26 is an organic compound that is an N-fatty acyl derivative of an amino acid. As indicated above, the compound can also be characterized as an N-alkyl derivative of a fatty acid amide or fatty acyl amide in which the N-alkyl group has a free carboxyl functional group. The hydrogen ion of the free carboxyl functional group provides a primary fluxing action in this molecule. The amino, or amide, portion of the compound is believed to chelate with metal surfaces, such as copper, or to coordinate or otherwise interact with such metal surfaces. The net result is that copper ions do not oxidize on a surface when that surface is covered with our coating 26. It is believed that our coating can not only be used to passivate copper surfaces on other products, but also passivate the surfaces of other metals. For example, we believe that our coating will also passivate copper alloys (alloys containing at least 50 atomic percent copper), brass, bronze, nickel, nickel alloys, iron/nickel alloys, kovar (an iron/nickel/cobalt alloy), the precious metals palladium, platinum and silver, alloys of such precious metals (i.e., alloys containing at least 50 atomic percent of the precious metal), and perhaps even aluminum and its alloys. In passivating such precious metals we believe that one can protect them from interaction with environmental impurities such as sulfur that have a tendency to adsorb on the surface.

While we focus on use of our coating 26 in the manufacture of circuit boards, we realize that the passivation afforded by our coating can have many other applications as well, especially where the passivated surface is to subsequently contact molten solder. The passivation and moisture resistance protection of our coating can have many applications on various products other than circuit boards, as for example electrical connectors, decorative silver plated products, products having reflective coatings, etc. While we focus on using our compound in soldering to copper surfaces, from the preceding paragraph it can be seen that our compound might provide special advantages when used in soldering to silver and silver alloy surfaces. Our compound can thus not only be used as a flux in soldering to silver or silver alloys, but it can also act as a passivating material to prevent tarnishing, i.e., corrosion, of the silver or silver alloy surface after soldering.

As for circuit board manufacture, our coating 26 is so compatible that it can be used to protect a copper pattern at almost any stage of the circuit board fabrication process. Accordingly, use of our coating can even make alternative techniques for defining copper patterns practical. For example, in the solder mask on base copper (SMOBC) process, where the HASL process is to be avoided, our coating 26 could be applied immediately after the solder layer is removed. This would allow the board to be stored for later use, and the solder resist applied just before soldering, without need for cleaning oxide off the copper surface. Our coating may even make it practical to use techniques other then SMOBC to delineate the copper pattern and immediately or concurrently protect it from oxidation. For example, one might initially clean the blanket copper sheet, apply our coating, and then apply an etch resist coating.

Our coating 26 offers still another benefit. It is a benefit available in the second phase of circuit board manufacturing referred to earlier in this specification. It is not available from the imidazole coatings. Our coating does more that just protect a copper surface from oxidation and be compatible with the soldering process. Our coating also can serve as a low ionic residue flux during the soldering process. such use is illustrated in FIG. 5. FIG. 5 shows an electrical component 20 bonded to copper conductors 16 and 18 by means of a solder layer 28. The solder layer 28 is formed during the wave soldering. In actual practice, the electrical component 20 is temporarily affixed to the surface of the circuit board, in contact with both of the conductors 16 and 18. Then, that surface is placed in contact with a solder wave to produce the permanent soldered connection, shown by solder layer 28, between the electrical component 20 and the conductors 16 and 18.

U.S. Pat. No. 4,684,544 Arnett, assigned to the assignee of this invention, discloses prior art wave soldering processes, with emphasis on the fluxing portion of those processes. It is incorporated herein by reference. Arnett discloses an improvement in fluxing for a traditional wave soldering process. In particular, Arnett discloses that there are problems in obtaining uniform fluxing action from a standing wave of hot flux foam. Arnett discloses a specific improvement in the fluxing station of the wave soldering machine to obtain a uniformity of small bubbles at the top of the flux standing wave. Such a soldering machine involves a station for applying flux to a circuit board while the side of the circuit board to be soldered is in face-down orientation, and an immediately following station for applying solder to the face-down board. The flux could also be applied by spraying.

In this invention, the fluxing station of the soldering machine can be omitted. The reason is that our coating 26 was applied earlier, and serves as a flux in addition to passivation of copper from oxidation during prior treatments and storage. Accordingly, our coating 26 is more than just wettable by molten solder, our coating provides fluxing action. The fluxing action is attributable to at least one free carboxyl group (—COOH) in the chemical compound that is the principal ingredient in our coating. By free carboxyl group, we mean an organic acid functional group having an ionizable hydrogen ion, as in acetic acid. Moreover, the fluxing activity of our coating can be enhanced further without compromising its copper passivation characteristic or significantly increasing ionic residues on the soldered circuit board. If a stronger activation is desired, one can add a small amount of a lower molecular weight organic acid to our coating. However it should be recognized that if one would add traditional organic acids to our coating, one runs the risk of increasing ionic residue on the circuit board after soldering. On the other hand, we have recognized that a certain specific activator can be added that will not significantly increase ionic residues. The specific activator we use, that is compatible with our coating system, is the three acid mixture (TAM) disclosed in each of U.S. Pat. No. 5,004,509 Bristol and U.S. patent application Ser. No. 08/203,176, filed Feb. 28, 1994 in the names of Bristol, Hanaway and Walls. More will be said about the addition of organic acid activators later in this specification.

Even without the addition of an organic acid activator, our coating 26 appears to smooth out the solder joints. The solder joints appear to be more rounded, and/or there is less of a tendency for solder ball formation during soldering. This is an important aspect of soldering. Our coating provides less tendency for bridging between solder joints and/or other exposed portions of the copper pattern. Bridging can occur as the solder joint pulls away from the standing solder wave during soldering. Bridging is caused by solder points that are formed on the solder joints as the solder joints pull away from the solder standing wave. The points usually are not long enough to provide an electrical short as-soldered. However, completion of the bridging might occur later due to an added corrosion or electromigration effect. A more troublesome problem is solder ball formation during soldering. A plurality of tiny solder balls can be formed as the point of the solder joint breaks away from the molten solder standing wave. The tiny solder balls line up as a contacting string of beads. The string can be long enough to bridge between two adjacent conductors on the surface of the circuit board. In such instance the string acts as a very thin line of solder. If the line almost bridges between the two conductors, the effect is even worse. It is difficult to detect, and it provides a potential point of failure by bridging due to subsequent corrosion or electromigration effects on the surface of the circuit board. Use of the Bristol three acid mixture as an added organic acid activator does not seem to interfere with obtaining the smoother solder joints and suppression of solder ball formation.

As indicated above, the addition of Bristol's special three acid mixture (TAM), or one or more organic acids, to our fatty acyl sarcosine can eliminate the need for a separate fluxing step during soldering. The elimination of the fluxing station from a soldering machine simplifies the soldering process and equipment, and reduces the related costs significantly.

Our special coating 26 can be applied before and/or after the application of solder resist coating 24. This provides a significant amount of flux on a circuit board surface. Only one layer of our coating 26 is shown in FIG. 5. On the other hand two layers are shown in FIG. 6, which will hereinafter be explained more fully. Moreover, coating the board with our flux-like coating 26 before placing the board in the solder machine permits the board to be inspected after coating, to check for uniformity and completeness of coverage of our coating. This is significant because it can be done before entry into the soldering machine. It is not easy to check how well fluxing is done on each board in a soldering machine.

Still further, a single application of flux is not enough for some applications. However, the usual soldering machines do not have enough room for two fluxing stations. In such applications, use of our coating provides an opportunity for double fluxing, even though the soldering machine usually does not have that capability.

The benefits of our coating 26 go even further. They extend to benefits after soldering as well. As indicated above, our coating 26 is also useful in a third phase of circuit board manufacturing. The third phase is the conformal coating phase. Some circuit boards are expected to be used in humid environments, which can cause corrosion. Heretofore, such circuit boards would be given a thick viscous protective coating, called a conformal coating, after components have been soldered to the board. Application of the conformal coating can be expensive and messy, if not difficult. In this connection, see U.S. Pat. No. 5,368,899 Litteral, which is assigned to the assignee hereof and which is hereby incorporated herein by reference.

Conformal coating requires added process steps. There are yield losses in performing any added process steps. In addition, added equipment, personnel, factory floor space, etc. are needed to perform the conformal coating step. It often requires troublesome masking steps, to prevent the conformal coating from covering contact areas and the like. Hence, conformal coating is not ordinarily used unless the added cost can be justified.

Our special coating 26 can be used on every circuit board without added cost. In addition, after soldering, there are residual portions of our coating that remain on the surface of the circuit board between soldered sites on the circuit board surface. Accordingly, all areas of the circuit board exposed in windows of the solder resist, after the soldering operation was complete, are still protected. They are protected by residual parts of our coating that were applied during circuit board fabrication.

Our coating 26 is hydrophobic in character due to the presence of at least one fatty acid group in the compound that is the principal component of our coating. More will hereinafter be said about this feature of that compound. This hydrophobic characteristic of our coating resists penetration by moisture. In many applications, this property is enough to avoid need for a conformal coating. In that sense, our coating is a substitute for a conformal coating. In another sense, it provides the added benefit of inherently providing moisture protection on every circuit board made, at no added cost. Testing thus far indicates that our coating eliminates the need for conformal coatings in many, if not most, applications.

While we have not yet observed this need yet, we recognize that it might possibly be advantageous to add one or more layers of our coating 26 after soldering to give an added measure of moisture protection, especially for particularly humid environments. The application of a second layer 26' on the circuit board is illustrated in FIG. 6. On the other hand, we probably would not want to include an added organic acid activator in such coatings 26' added after soldering, as they may tend to leave a higher residual ionic residue. As indicated above, higher ionic residues generally are to be avoided, as they accelerate corrosion.

It should also be mentioned that one may choose to form our coating 26 by applying more than one layer of our coating material. One might choose to do this at any stage in processing. In addition, one may choose to use multiple layers to form coating 26 at more than one stage of the manufacturing process. Alternatively, one may only want to use our coating 26 to protect copper from oxidation during heat treatments or storage, or use it only as a flux, or use it only as a substitute for a conformal coating. The use of our coating would dictate the particular stage of manufacturing at which it is most effectively applied. It may even turn out that in some applications, one might want to use our coating as well as a traditional fluxing operation, or to use it under and/or over a traditional conformal coating operation. It is conceivable that this might provide enhanced corrosion protection. It might even prove to be useful to use our coating in combination with the imidazole coating referred to above, to obtain enhanced copper protection. Still further, our coating can be applied in any convenient manner, as for example dipping, spraying, roller coating, brushing, etc.

Reference is now made to compositional details of our coating. In our preferred coating, the principal ingredient is an N-fatty acyl derivative of an amino acid. It can also be characterized as an N-alkyl group derivative of a fatty acyl amide in which the N-alkyl group has a free carboxyl functional group.

In a preferred embodiment, the principle ingredient of our coating is N-fatty acyl sarcosine. Sarcosines are derivatives of sarcosinic acid. Sarcosinic acid, also referred to as sarcosine acid, is a partially methylated derivative of glycine, which is the simplest of the amino acids. N-fatty acyl sarcosines can function as wetting agents, in addition to the properties noted above. We wish to also note that they also can function as antistatic agents. We believe that their antistatic agent properties are the properties that help suppress solder ball formation when our coating is used as a flux during wave soldering.

Figure 7A:
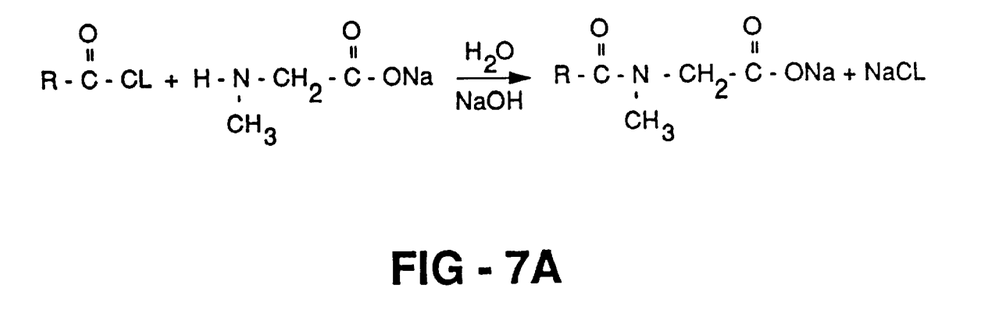
FIG. 7A shows a chemical equation for a chemical reaction that produces a fatty acyl sarcosinate.
Figure 7B:
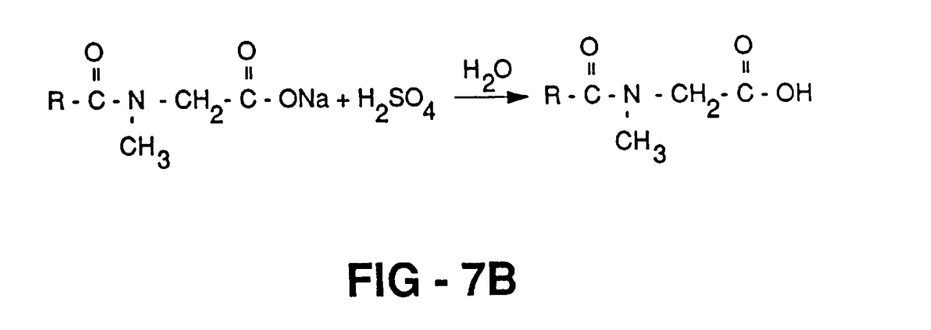
FIG. 7B shows a chemical equation for converting an N-fatty acyl sarcosinate to an N-fatty acyl sarcosinic acid.

Preparation of an N-acyl sarcosine is empirically shown in FIGS. 7A and 7B of the drawing. In FIG. 7A a fatty acid chloride is combined with sodium sarcosinate in an aqueous alkaline medium to produce a sodium salt of the fatty sarcosinate. As shown in FIG. 7B, the fatty sarcosinic acid is then obtained by reacting the sodium salt of the fatty sarcosinate with sulfuric acid. Other salts of fatty sarcosinic acid can be made, that release the fatty sarcosinic acid. Examples are ammonium, potassium, triethanolamine, etc. Such materials are commercially available as Hamposyl® surfactants from Hampshire Chemical Corporation, Lexington, Mass. 02173.

The N-fatty sarcosine, also referred to as an N-fatty acyl sarcosine, preferred for use in this invention may vary depending on the application. N-Lauroyl Sarcosine, which is also referred to as lauroyl sarcosinic acid, may be preferred for some applications. However, other N-fatty acyl sarcosines or mixtures of such N-fatty acyl sarcosines, may be preferred for other applications. Generally, we prefer to use the N-fatty acyl sarcosine acid itself, rather than the salt of such an acid. The reason is that the metal ion of the salt, i.e., the cation of the N-fatty sarcosinate, may be an objectionable ion on the coated surface. As indicated herein, we prefer to maintain as low an ionic residue on circuit boards as we can. Hence, if our coating is to be used on a circuit board, we would probably prefer to use the N-fatty sarcosinic acid as the source of the relevant sarcosinate anion, instead of the N-fatty sarcosinate salt. On the other hand, we want it to be appreciated that one might find that in some instances it might be acceptable to provide the relevant N-fatty sarcosinate anion by means Qf an N-fatty sarcosinate salt.

Figure 8A:
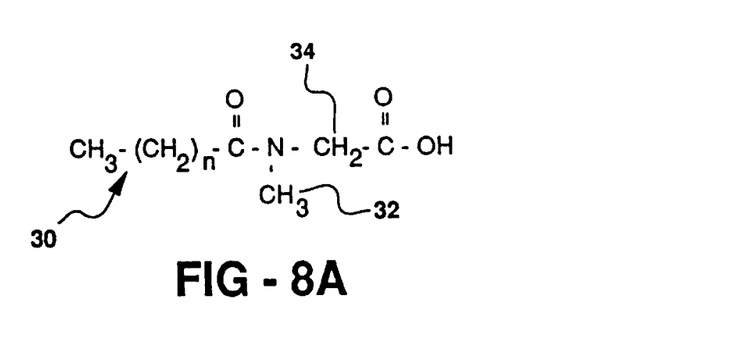
FIG. 8A shows a structural formula for an N-fatty acyl sarcosinic acid.

The alkyl portion of the fatty acyl component of the N-fatty acyl sarcosine is represented at the left in FIG. 8A by the expression $CH_3-(CH_2)_n-$. This is consistent with the alkyl portion of the lauroyl group in lauroyl sarcosinic acid. On the other hand, as will be more fully explained, the alkyl portion of the acyl group of the sarcosine of this invention might be branched and/or unsaturated. The alkyl portion of the acyl group is represented in shorter form, and more generically by the letter $R_1$ in FIGS. 8B, 9A, 9B and 9C. The carbon chain length and structure of the alkyl portion $R_1$, reference numeral 30, of the fatty acyl group can vary. The expression $CH_3$—$(CH_2)_n$— has been replaced by the generic expression $R_1$ in FIGS. 8B, 9A, 9B and 9C.

Accordingly, $CH_3$—$(CH_2)_n$— and $R_1$ can be hydrocarbon chains of any length that would impart hydrophobic properties to the resultant compound and not interfere with the passivating properties of the compound. It appears that any alkyl group, especially an alkane group, of about 9–25 carbon atoms might generally be satisfactory but most preferably of about 11–20 carbon atoms. However, we recognize that there are fatty acids of shorter chain lengths, as for example in butyric acid, caproic acid and caprylic acid, all of which are found in butter. It is possible these shorter carbon chain fatty acids may provide sufficient hydrophobic properties in the resultant sarcosine for some applications.

On the other hand, we would prefer that $CH_3$—$(CH_2)_n$— and $R_1$ be a longer carbon chain, such as $CH_3$—$(CH_2)_{10}$— in lauric acid. For completeness, we note that the carbon chains $R_1$ in the lower molecular weight fatty acids are as follows: butyric ($C_3H_7$—); caproic ($C_5H_{11}$—), caprylic ($C_7H_{15}$—), capric ($C_9H_{19}$—). The preferred fatty acids which provide longer chain lengths for $R_1$, for example, are myristic ($C_{13}H_{27}$—) palmitic ($C_{15}H_{31}$—), stearic ($C_{17}H_{35}$—) arachidic ($C_{19}H_{31}$—), and lignoceric ($C_{23}H_{47}$—).

All of the fatty acids mentioned in the preceding paragraph are saturated fatty acids. It is to be recognized that there are also unsaturated fatty acids, as for example, oleic ($C_{17}H_{33}$) and erucic ($C_{21}H_{41}$) which contain only one double bond. Analogously, $R_1$ could be a hydrocarbon group containing two double bonds as for example in linoleic acid where the carbon chain is $C_{17}H_{39}$—. It is to be recognized, that there are fatty acids that have hydrocarbon chains with three and four double bonds, as respectively for example linolenic acid and arachidonic acid. These other fatty acids may also prove to be useful as $R_1$ in the acyl group of the N-acyl sarcosine of this invention.

While not expected, we recognize that it is conceivable that the alkyl group $R_1$ could be a substituted alkyl group. By that we mean that one or more of the hydrogens in the alkyl portion of the fatty acyl group could be replaced by another atom or by a functional group that enhances passivation, fluxing, or moisture resistance of the coating. No testing has been done so far to determine whether such substituted alkyl portions are desirable or detrimental. On the other hand, it is recognized that there are fatty acids, such as cerebronic and ricinoleic, that contain hydroxyl groups in their chains. Their use is not expected to provide as high a moisture resistance as the alkyl portions of our preferred acids but future testing only will determine their true value. Analogously, we note that there are cyclic fatty acids, such as chaulmoogric acid ($C_{17}H_{31}COOH$) that are within our preferred range of carbon chain length.

Figure 8B:
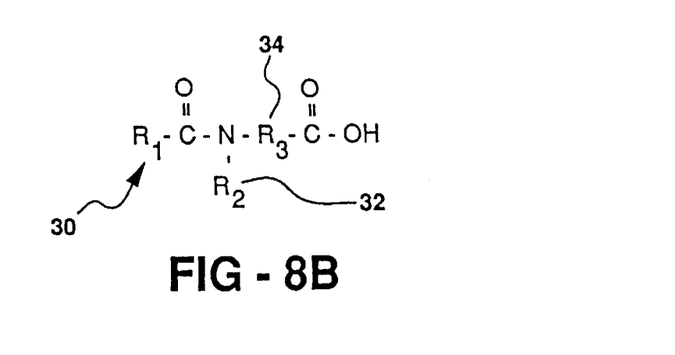
FIG. 8B shows the structural formula of FIG. 8A in which carbons atoms and carbon chains are designated by the letter R to generically characterize N-fatty acyl sarcosinic acid.

Accordingly, it can be seen that $R_1$ can be any saturated or unsaturated hydrocarbon chain or cyclic group, substituted or un-substituted, so long as it imparts a hydrophobic characteristic to the resultant N-acyl sarcosine compound contemplated in FIGS. 8A and 8B. If the resulting compound is not also going to be used for its passivation or fluxing properties, it may not be of as much significance of the particular alkyl portion selected for $R_1$ enhances or detracts from the passivation or fluxing properties of the compound.

Sarcosine acid, itself, can be viewed as being a partially alkylated amino acid. By partially alkylated we mean that one of the hydrogens of the amine group in the amino acid has been replaced by a hydrocarbon group. In sarcosine acid, this latter alkyl group is a methyl group. In FIG. 8A, it is the methyl group 32 directly linked to the same nitrogen to which the fatty acyl group is linked. In FIG. 8B, this methyl group 32 is designated by $R_2$. It is still uncertain how much $R_2$ can be varied. However, it is expected that $R_2$ could also be an ethyl or propyl group. Hence, $R_2$ would preferably be 1–3 carbon hydrocarbon group. On the other hand, since it is still uncertain what role this group plays in the compound of our coating, it is possible that some of the advantages of our invention might be achievable when $R_2$ is only a hydrogen atom, or perhaps a hydrocarbon group of more than 3 carbon atoms but not likely more than five carbon atoms.

As indicated above, it is believed that the acyl nitrogen, or amide, portion of the N-acyl sarcosine molecule is important to passivation. It would appear therefore that $R_2$ could be any hydrocarbon grouping so long as it does not interfere with the passivating function of this molecule with respect to metal, especially copper, surfaces. Accordingly $R_2$ while it would preferably be a methyl group, it is believed that it might be possible that $R_2$ could also be a more extended group as for example an ethyl or propyl group. It may even turn out that $R_2$ could be an extended carbon chain, which provides additional hydrophobic properties to the resultant compound. As hereinafter described, it may even be beneficial for $R_2$ to be, or include, a free carboxyl group (—COOH).

Reference is now made to $R_3$ in FIG. 8B. In FIG. 8B, the $CH_2$ group (reference numeral 34 in FIG. 8A) of the sarcosine acid is referred to by the designation $R_3$. It is in the alpha position with respect to the free carboxyl group in this molecule. It is believed that highest ionic activity, and therefore the best fluxing action, is obtained if $R_3$ is only one carbon atom, or two at most. On the other hand, it is conceivable that one might not desire significant, or even any, fluxing if the coating is just to be used for passivation and/or protection from moisture. In such instance, making $R_3$ of two or more carbon atoms may be advantageous in that it might make the resultant compound more hydrophobic.

Further, the passivation properties of the molecule may be dependent on the amine nitrogen atom being directly linked to the alpha carbon atom. If so, $R_3$ would preferably be a one-carbon hydrocarbon group ($CH_2$). If not, then $R_3$ could be $(CH_2)_n$ where is 1–3, or even 1–5. If one considers that our compound is a derivative of sarcosine acid, it would seem likely that $R_3$ would only be $CH_2$, and not a multiple of $CH_2$. On the other hand, as will be discussed further in connection with FIGS. 9A, 9B and 9C, when one considers that the N-acyl sarcosine is also an amide, it becomes more plausible that $R_3$ might readily be a multiple of $CH_2$ units.

Figure 9A:
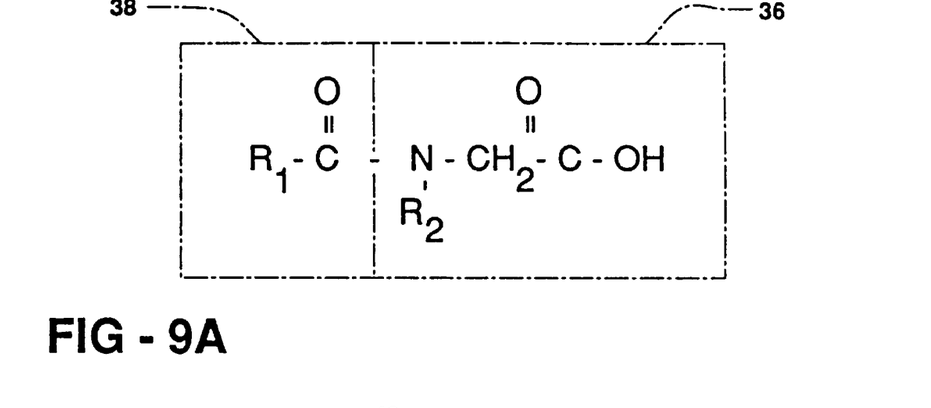
FIG. 9A shows a modification of the FIG. 8B structural formula in which fatty acyl and amino acid portions are enclosed in separate boxes.

As indicated in the preceding paragraph, one can consider that our special compound, shown in connection with FIGS. 7A, 7B, 8A and 8B, is a derivative of an amino acid called sarcosine acid. The sarcosine acid portion is shown in FIG. 9A in the box designated by reference numeral 36. The fatty acid group or acyl group, is shown within the box designated by reference numeral 38. If $R_2$ is a methyl group, the portion of the compound enclosed within box 36 is sarcosine acid in which the remaining hydrogen on the amino nitrogen is attached to the carbonyl carbon of the acyl group. Hence, this compound is referred to as a fatty sarcosine. However, as shown in FIG. 9B, one can also draw this structural formula in a slightly different format, which we refer to herein as an amide format.

Figure 9B:
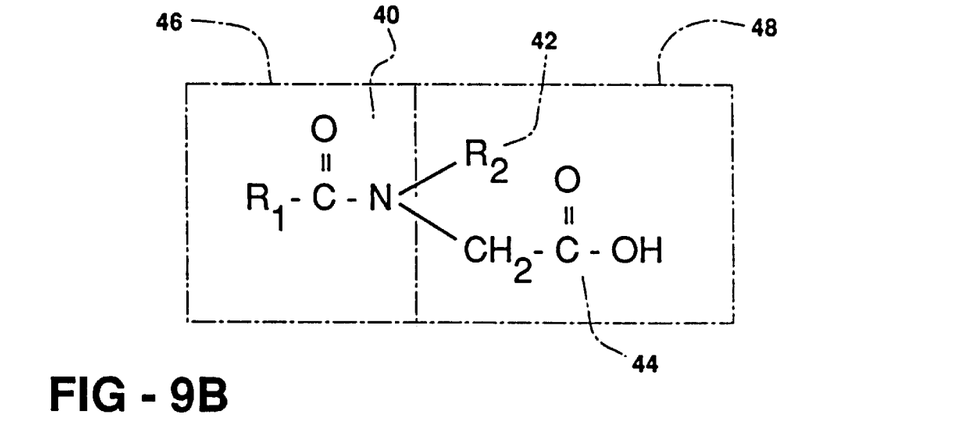
FIG. 9B shows the structural formula of FIG. 9A in which a primary amide portion is enclosed in one box, and first and second alkyl groups are enclosed in a second box.

In the FIG. 9B format, our compound is shown to be an alkyated amide of a fatty acid. The amide portion 40 is alkylated, i.e., the amide hydrogens are replaced, with a methyl group 42 and an acetic acid group 44. The formula can then be divided into a fatty acid amide portion enclosed within box 46 and two organic groupings 42 and 44 in box 48. Metal passivation and chelation by the amide structure is thus quite understandable. Fluxing action by the acetic acid group also becomes more understandable, and that it might be replaceable by a propionic acid or longer acid group.

As indicated above, $R_2$ (the methyl group of sarcosine acid) in FIG. 9B can be considered as an alkyl group replacing one of the two hydrogens of the amide. The $CH_2$—COOH, or acetyl, portion in box 48 would be a second organic group replacing the second of the two hydrogens of the fatty acid amide. The $R_1$ portion of the compound still provides the hydrophobic properties to the compound. The acetyl group 44 provides an acidic property for fluxing, and perhaps also for passivation of copper prior to fluxing. $R_2$ apparently does not contribute to chelation or coordination passivation effect of the amide structure. Accordingly, it is more understandable that $R_2$ is not necessarily confined to being a methyl group. It could be an ethyl group or propyl group, etc., so long as it does not interfere with the passivation effect of the resulting compound.

Figure 9C:
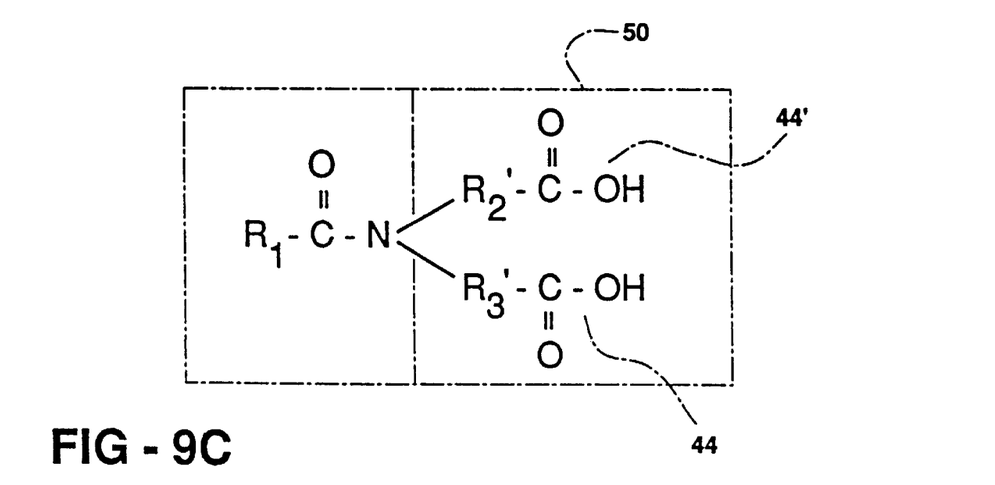
FIG. 9C shows a modification of the structural formula shown in FIG. 9B in which both alkyl groups in the second box have free carboxyl functional groups.

Still further, it may desirable that $R_2$ be a group that is, or includes, a second free carboxyl group. For example, $R_2$ could be a carboxyl group (—COOH) itself or an acetyl group such as is the other alkyl group attached to the amide nitrogen. The result would be a compound such as shown in FIG. 9C. In FIG. 9C, $R_2$ has been replaced with free carboxyl group such as 44. In such instance, box 50 of FIG. 9C contains two groups that have free carboxyl functional groups. The group replacing $R_2$ is designated by reference numeral 44', to indicate its similarity to group 44. Analogously, $R_2'$ is used in group 44' to indicate that might be just a —$CH_2$— group. Such a compound would inherently have additional fluxing action. On the other hand, it may contribute to an increase in ionic residue, which as mentioned before is objectionable. Further testing would have to made to determine this. In any event, for convenience, we choose to refer to our compound as a fatty acid sarcosine.

In order to apply our coating material we dissolve the principal coating ingredient, the N-fatty acyl sarcosine in a volatile vehicle. Preferably, and especially so for coating circuit boards, the volatile vehicle is one that will evaporate leaving no ionic residue. A preferred vehicle is a blend of isopropyl alcohol and deionized water, or N-methyl-2-pyrrolidone and deionized water. On the other hand, any vehicle can be used which leaves no appreciable ionic residue. We have mentioned that the N-fatty acyl sarcosines can function as wetting agents. However, in this invention, we use them in a much higher concentration than one would use them if they were used merely for their wetting agent properties. The concentration of N-fatty acyl sarcosine we use is a concentration more similar to the concentration of organic acid component one would use to make up a prior art low ionic residue flux. For example, we dissolve enough N-fatty acyl sarcosine into the vehicle to constitute about 0.5–6 weight percent, preferably about 1.0–2.5 weight percent, of the resultant solution. This concentration will generally allow one application of the solution to provide an effective coating at any given stage of manufacture, even if the circuit board is to be recoated at successive stages of manufacture. Obviously, if multiple applications of the solution are to be used to form the coating at any given stage of manufacture, solutions of lesser strength might be useful. Higher strength solutions of many of the N-fatty acyl sarcosines can be more viscous, and thus harder to apply. Hence, the higher strength solutions are not generally preferred.

As indicated above, the N-fatty acyl sarcosine is the principal substance in our coating. One may optionally want to use a small amount of a special surfactant, such as an antistatic agent, preferably one with nitrogen and/or carbonyl functional groups, with the carbonyl functional group (if present) being adjacent the nitrogen. Preferred surfactants would be, for example, FC-170C and FC-171 which are available from 3M Company, Tetronic 701 and Tetronic 90R4 which are obtainable from BASF, and ATSURF and F-21, which are available from ICI Americas Inc. Such surfactants should be used in their normal concentrations, as for example about 0.01 to 0.1 weight percent. This is decidedly less than the concentration of the N-fatty acyl sarcosines used in this invention.

As indicated above, the fatty acyl sarcosines that are particularly of interest in connection with this invention are N-Cocoyl Sarcosine, N-Lauroyl Sarcosine, N-Myristoyl Sarcosine, N-Oleoyl Sarcosine, and N-Stearoyl Sarcosine. The cocoyl fatty acids are derived from coconut oil. The N-fatty acyl sarcosines can be used alone or in combination. As indicated above, these substances appear to provide high copper passivation and moisture protection but may not provide a strong enough fluxing action for some applications. We described above how these substances might be modified to enhance their fluxing characteristics. On the other hand, we also mentioned that in modifying these substances one runs the risk of reducing the passivation and/or moisture protection properties, and might cause an increase in ionic residue after soldering.

We have found another alternative for increasing fluxing performance. This other alternative has been found to be particularly useful with fatty acyl sarcosines such as N-Cocoyl Sarcosine, N-Lauroyl Sarcosine, N-Myristoyl Sarcosine, N-Oleoyl Sarcosine and N-Stearoyl Sarcosine. Enhanced fluxing has been obtained without any significant increase in ionic residues or reduction in passivation or moisture protection. This other alternative for increasing fluxing performance resides in adding a small amount of a special three acid mixture (TAM) to the solution of our coating material. The three acid mixture (TAM) is a mixture is about 15–30% succinic acid, 40–63% glutaric acid and 10–30% adipic acid. As pointed out in the aforementioned U.S. Pat. No. 5,004,509 Bristol, which is incorporated herein by reference, this particular mixture of organic acids has a uniquely low boiling point of about 150–210° C. Soldering is usually done at temperatures of about 200–500° C. Hence, if soldering is done at above the boiling point temperature of the particular TAM mixture used, the mixture evaporates, to leave little or no ionic residue. Because most soldering is done at a temperature above about 210° C., even the highest boiling point TAM will evaporate in most soldering operations. On the other hand, it does not evaporate before it serves it fluxing purposes.

When mixed with our fatty acyl sarcosines listed above, the TAM appears to act substantially the same as it would if it were used alone. By that we mean it fluxes as well, and evaporates during soldering to leave little or no ionic residue. When dissolved in the volatile carrier with the N-fatty acyl sarcosine, we suggest only using about 0.05–1.0% by weight, preferably only about 0.1–0.3% by weight. It can be used in the N-fatty acyl sarcosine solution with or without the addition of the nonionic fluorinated surfactant.

For completeness, it should be mentioned here that many other organic acids, both monobasic and polybasic, are known to be flux activators. It is expected that many of the known flux activators could be substituted for our preferred TAM activator. However, we believe that all of these other activators would provide an increase in ionic residue after soldering, over our preferred TAM activator. Accordingly, they are not preferred. On the other hand, we recognize that selected ones of such organic acids, when used in low concentrations, might possibly enhance fluxing enough for some applications without objectionably increasing ionic residue for those applications. Hence, we wish to note that such organic acids might be useful as an additive to our N-fatty acyl sarcosines, instead of the TAM, for selected soldering applications.

It should also be mentioned that no particular heating is needed to vaporize the volatile carrier used to apply our special coating compound. Accordingly, no special mention of heating has been made. On the other hand, we see no particular objection to warming the solution and/or the product being coated, so long as proper safety precautions are used. On the other hand, we have found best coating uniformity is obtained if the rate of vaporization of the volatile vehicle, i.e., drying, is moderate to slow, as for example room temperature drying or drying at 40–60° C.

By way of example, we list the following examples of preferred solutions that can be used to apply the coating of our invention:

| Example 1 | |
|---|---|
| Deionized Water | 54.30 |
| Isopropyl Alcohol | 44.00 |
| Cocoyl Sarcosine | 1.50 |
| TAM Activator | 0.20 |
| | 100.00 |

| Example 2 | |
|---|---|
| Deionized Water | 55.00 |
| Isopropyl Alcohol | 42.30 |
| Cocoyl Sarcosine | 2.50 |
| TAM Activator | 0.20 |
| | 100.00 |

| Example 3 | |
|---|---|
| Deionized Water | 52.00 |
| Isopropyl Alcohol | 43.80 |
| Cocoyl Sarcosine | 4.00 |
| TAM Activator | 0.20 |
| | 100.00 |

| Example 4 | |
|---|---|
| Deionized Water | 50.30 |
| Isopropyl Alcohol | 44.00 |
| Cocoyl Sarcosine | 5.50 |
| TAM Activator | 0.20 |
| | 100.00 |

| Example 5 | |
|---|---|
| Deionzed Water | 54.30 |
| Isopropyl Alcohol | 44.00 |
| Cocoyl Sarcosine | 1.50 |
| TAM Activator | 0.20 |
| | 100.00 |

-continued

| Example 6 | |
|---|---|
| Deionized Water | 55.00 |
| Isopropyl Alcohol | 42.30 |
| Oleoyl Sarcosine | 2.50 |
| TAM Activator | 0.20 |
| | 100.00 |

| Example 7 | |
|---|---|
| Deionized Water | 52.00 |
| Isopropyl Alcohol | 43.80 |
| Oleoyl Sarcosine | 4.00 |
| TAM Activator | 0.20 |
| | 100.00 |

| Example 8 | |
|---|---|
| Deionized Water | 50.30 |
| Isopropyl Alcohol | 44.00 |
| Oleoyl Sarcosine | 5.50 |
| TAM Activator | 0.20 |
| | 100.00 |

Examples 9–12 were the same as Examples 5–8 except that Lauroyl Sarcosine was used instead of Oleoyl Sarcosine.

Examples 13–16 were the same as Examples 9–12 except that Myristoyl Sarcosine was used instead of Lauroyl Sarcosine.

Examples 17–20 were the same as Examples 13–16 except that Stearoyl Sarcosine was used instead of Myristoyl Sarcosine.

| Example 21 | |
|---|---|
| Deionized Water | 54.30 |
| Isopropyl Alcohol | 43.95 |
| Cocoyl Sarcosine | 0.75 |
| Oleoyl Sarcosine | 0.75 |
| TAM Activator | 0.25 |
| | 100.00 |

| Example 22 | |
|---|---|
| Deionized Water | 55.00 |
| Isopropyl Alcohol | 42.25 |
| Oleoyl Sarcosine | 1.25 |
| Lauroyl Sarcosine | 1.25 |
| TAM Activator | 0.25 |
| | 100.00 |

| Example 23 | |
|---|---|
| Deionized Water | 52.00 |
| Isopropyl Alcohol | 43.75 |
| Oleoyl Sarcosine | 3.00 |
| Stearoyl Sarcosine | 1.00 |
| TAM Activator | 0.25 |
| | 100.00 |

| Example 24 | |
|---|---|
| Deionized Water | 50.25 |
| Isopropyl Alcohol | 44.00 |
| Oleoyl Sarcosine | 2.75 |
| Myristoyl Sarcosine | 2.75 |
| TAM Activator | 0.25 |
| | 100.00 |

-continued

Example 25

| | |
|---|---|
| Deionized Water | 55.25 |
| Isopropyl Alcohol | 42.55 |
| Cocoyl Sarcosine | 1.00 |
| Lauroyl Sarcosine | 1.00 |
| TAM Activator | 0.20 |
| | 100.00 |

Example 26

| | |
|---|---|
| Deionized Water | 52.80 |
| Isopropyl Alcohol | 43.40 |
| Cocoyl Sarcosine | 2.20 |
| Stearoyl Sarcosine | 1.40 |
| TAM Activator | 0.20 |
| | 100.00 |

Example 27

| | |
|---|---|
| Deionized Water | 54.75 |
| Isopropyl Alcohol | 42.05 |
| Cocoyl Sarcosine | 1.80 |
| Myristoyl Sarcosine | 1.20 |
| TAM Activator | 0.20 |
| | 100.00 |

Example 28

| | |
|---|---|
| Deionized Water | 54.75 |
| Isopropyl Alcohol | 42.05 |
| Lauroyl Sarcosine | 1.50 |
| Stearoyl Sarcosine | 1.50 |
| TAM Activator | 0.20 |
| | 100.00 |

Example 29

| | |
|---|---|
| Deionized Water | 54.75 |
| Isopropyl Alcohol | 42.05 |
| Lauroyl Sarcosine | 1.50 |
| Myristoyl Sarcosine | 1.50 |
| TAM Activator | 0.20 |
| | 100.00 |

In some of the Examples above, isopropyl alcohol can be replaced in varying amounts by N-methyl-2-pyrrolidone with or without TAM activator.

It is believed that this invention can be modified in many ways consistent with the description hereinbefore set forth. In particular, our coating can be of one or more of our primary compounds, alone or with the distinctive three acid mixture (TAM) that is described and claimed in U.S. Pat. No. 5,004,509 which was issued to S. V. Bristol, one of the co-inventors named herein. Also, our coating can include surfactants. Still further various modifications to the primary ingredient of our coating are possible. Still other modifications are possible. Accordingly, it is to be understood that the protection sought and to be afforded hereby should be deemed to extend to all subject matter defined by the appended claims, including all fair equivalents thereof.

What is claimed is:

1. A film-forming composition consisting essentially of:
a volatile carrier; and
an organic acid that includes an ionizable carboxyl group from an organic acid having up to five carbon atoms, an amino group attached to a carbon atom of said organic acid, and an acyl portion of a fatty acid group substituted for one of two hydrogens in the amino group.

2. The composition as defined by claim 1 wherein:
the volatile carrier contains about 1.0–2.5 weight percent of said organic acid.

3. The composition as defined by claim 1 wherein:
the volatile carrier contains about 0.5–6 weight percent of said organic acid.

4. The composition as defined by claim 3 wherein:
the volatile carrier also includes an organic acid activator that is a mixture of organic acids consisting essentially of, by weight, about 15–30% succinic acid, 40–63% glutaric acid, and 10–30% adipic acid, which mixture has a boiling point of about 150–210° C.,
effective to provide enhanced fluxing action for said composition.

5. The composition as defined by claim 4 wherein:
the volatile carrier also contains about 0.01–0.1 weight percent of a surfactant.

6. The composition as defined by claim 3 wherein:
the volatile carrier is at least one member selected from the group consisting of an alcohol, a blend of an alcohol and deionized water, and a blend of deionized water and N-methyl-2-pyrrolidone.

7. The composition as defined by claim 6 wherein:
the organic acid is at least one member selected from the group consisting of N-Cocoyl Sarcosine, N-Lauroyl Sarcosine, N-Myristoyl Sarcosine, N-Oleoyl Sarcosine, and N-Stearoyl Sarcosine.

8. A film on a metal surface, said metal being a metal selected from the group consisting of copper and copper alloys, brass, bronze, nickel, nickel alloys, palladium, palladium alloys, platinum, platinum alloys, silver, silver alloys, aluminum and aluminum alloys, said film consisting essentially of:
an organic acid that includes an ionizable carboxyl group from an organic acid having up to five carbon atoms, an amino group attached to a carbon atom of said organic acid, and an acyl portion of a fatty acid group substituted for one of two hydrogens in the amino group, effective to provide a passivating effect on metal surface.

9. The film on said metal surface as defined by claim 8 wherein:
the organic acid is at least one member selected from the group consisting of N-Cocoyl Sarcosine, N-Lauroyl Sarcosine, N-Myristoyl Sarcosine, N-Oleoyl Sarcosine, and N-Stearoyl Sarcosine; and
said metal surface is copper.

* * * * *